(12) United States Patent
Choi et al.

(10) Patent No.: US 8,946,026 B2
(45) Date of Patent: Feb. 3, 2015

(54) METHODS OF FABRICATING A SEMICONDUCTOR DEVICE INCLUDING METAL GATE ELECTRODES

(75) Inventors: Sukhun Choi, Suwon-si (KR); Boun Yoon, Seoul (KR); Jae-Jik Baek, Seongnam-si (KR); Byung-Kwon Cho, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 374 days.

(21) Appl. No.: 13/238,284

(22) Filed: Sep. 21, 2011

(65) Prior Publication Data

US 2012/0129331 A1 May 24, 2012

(30) Foreign Application Priority Data

Nov. 24, 2010 (KR) .................. 10-2010-0117666

(51) Int. Cl.
*H01L 21/8238* (2006.01)
*H01L 21/3213* (2006.01)
*H01L 21/28* (2006.01)
*H01L 29/49* (2006.01)
*H01L 29/66* (2006.01)
*H01L 29/78* (2006.01)

(52) U.S. Cl.
CPC .... *H01L 21/32139* (2013.01); *H01L 21/28088* (2013.01); *H01L 21/823842* (2013.01); *H01L 29/4966* (2013.01); *H01L 29/66545* (2013.01); *H01L 29/78* (2013.01)
USPC .................. 438/275; 438/585; 257/E21.655

(58) Field of Classification Search
USPC ................................ 438/216, 275, 585, 591
See application file for complete search history.

(56) References Cited

U.S. PATENT DOCUMENTS

| | | | |
|---|---|---|---|
| 6,873,048 B2 | 3/2005 | Gao et al. | |
| 2007/0148876 A1* | 6/2007 | Yu | 438/275 |
| 2009/0230479 A1* | 9/2009 | Hsu et al. | 257/369 |
| 2010/0068875 A1 | 3/2010 | Yeh et al. | |
| 2010/0155906 A1* | 6/2010 | Lee et al. | 257/623 |
| 2011/0147853 A1* | 6/2011 | Lin et al. | 257/379 |
| 2011/0248359 A1* | 10/2011 | Hwang et al. | 257/410 |

FOREIGN PATENT DOCUMENTS

| | | |
|---|---|---|
| JP | 2004-260165 | 9/2004 |
| JP | 2009-33032 | 2/2009 |
| KR | 10-0695640 | 3/2007 |

* cited by examiner

*Primary Examiner* — Thanhha Pham
(74) *Attorney, Agent, or Firm* — Ellsworth IP Group PLLC

(57) ABSTRACT

A method of fabricating semiconductor devices having metal gate electrodes includes forming an insulating layer on a semiconductor substrate having a first region and a second region. The insulating layer is formed to include an interlayer insulating layer and a gate insulation layer. The interlayer insulating layer has first and second grooves respectively disposed in the first and second regions, and the gate insulation layer covers at least bottom surfaces of the first and second grooves. A laminated metal layer is formed on the substrate having the insulating layer. A planarization layer having non-photo sensitivity is formed on the laminated metal layer. The planarization layer in the first region is selectively removed using a dry etching process to expose the laminated metal layer in the first region and to form a planarization layer pattern covering the laminated metal layer in the second region.

28 Claims, 11 Drawing Sheets

METHODS OF FABRICATING A SEMICONDUCTOR DEVICE INCLUDING METAL GATE ELECTRODES

CROSS-REFERENCE TO RELATED APPLICATIONS

This U.S. non-provisional patent application claims priority under 35 U.S.C. §119 to Korean Patent Application No. 10-2010-0117666, filed on Nov. 24, 2010, the entirety of which is incorporated by reference herein.

BACKGROUND OF THE INVENTION

1. Field of the Invention

The present disclosure herein relates to methods of fabricating a semiconductor device and, more particularly, to methods of fabricating a semiconductor device including metal gate electrodes.

2. Description of the Related Art

Complementary metal-oxide-semiconductor (CMOS) integrated circuits have been widely employed to reduce power consumption of semiconductor devices. The CMOS integrated circuits comprise N-channel MOS transistors and P-channel MOS transistors.

As the semiconductor devices become more highly integrated, channel lengths of the N-channel MOS transistors and the P-channel MOS transistors have been gradually reduced. That is, as the integration density of the semiconductor devices increases, widths of gate electrodes of the MOS transistors have been reduced. In this case, the electrical resistance of the gate electrodes may increase to degrade performance of the semiconductor devices.

Recently, methods of forming the gate electrodes using a metal layer have been proposed in order to reduce the electrical resistance of the gate electrodes. However, in the event that the gate electrodes are formed of a metal layer, it may be difficult to pattern the metal layer using a photolithography and etching technique. Thus, a damascene technique may be employed to form metal gate electrodes without use of the photolithography and etching technique. The metal gate electrodes of the N-channel MOS transistors may be formed of a metal layer having a different work function from the metal gate electrodes of the P-channel MOS transistors. This is for optimizing threshold voltage characteristics of the N-channel MOS transistors and the P-channel MOS transistors.

In order to meet the requirements described above, it may be necessary to form a metal layer on a substrate including an N-channel MOS transistor region and a P-channel MOS transistor region and to selectively etch the metal layer in the N-channel MOS transistor region (or the P-channel MOS transistor region). A photoresist pattern may be used as an etching mask to selectively etch a portion of the metal layer. The photoresist pattern may be formed using an exposure process to selectively expose a portion of a photoresist layer to a specific light and a developing process to selectively remove the exposed portion of the photoresist layer. When the exposed photoresist layer is located in a narrow and deep groove, it may be difficult to completely remove the exposed photoresist layer. As a result, there may be limitations in optimizing characteristics of the CMOS integrated circuits and improving yield of the semiconductor devices.

SUMMARY OF THE INVENTION

Embodiments of the inventive concept are directed to methods of fabricating a semiconductor device including metal gate electrodes.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept may be achieved by providing a method including forming an insulating layer on the semiconductor substrate having a first region and a second region. The insulating layer is formed to include an interlayer insulating layer and a gate insulation layer. The interlayer insulating layer has first and second grooves respectively disposed in the first and second regions, and the gate insulation layer covers at least bottom surfaces of the first and second grooves. A laminated metal layer is formed on the substrate including the insulating layer. A planarization layer having non-photo sensitivity is formed on the laminated metal layer. The planarization layer is formed to fill the first and second grooves. The planarization layer in the first region is selectively removed using a dry etching process to expose the laminated metal layer in the first region and to form a planarization layer pattern covering the laminated metal layer in the second region.

The first region may include an N-channel MOS transistor region and the second region may include a P-channel MOS transistor region.

The forming the insulating layer may include sequentially forming a gate insulation layer and a dummy conductive layer on the semiconductor substrate including the first and second regions, patterning the dummy conductive layer and the gate insulation layer to form a first gate insulation layer and a first dummy gate electrode sequentially stacked in the first region as well as a second gate insulation layer and a second dummy gate electrode sequentially stacked in the second region, forming an interlayer insulating layer on the substrate having the first and second dummy gate electrodes, planarizing the interlayer insulating layer to expose the first and second dummy gate electrodes, and removing the exposed dummy gate electrodes to form a first groove exposing the first gate insulation layer and a second groove exposing the second gate insulation layer.

The forming the insulating layer may include forming a dummy material layer on the semiconductor substrate having the first and second regions, patterning the dummy material layer to form a first dummy gate pattern in the first region and a second dummy gate pattern in the second region, forming an interlayer insulating layer on the substrate having the first and second dummy gate patterns, planarizing the interlayer insulating layer to expose the first and second dummy gate patterns, removing the exposed dummy gate patterns to form a first groove in the first region and a second groove in the second region, and forming a conformal gate insulation layer on the substrate having the first and second grooves. The laminated metal layer may be formed on the gate insulation layer.

The non-photo sensitive planarization layer may be formed of a spin on hardmask (SOH) layer or an amorphous carbon layer (ACL), and the dry etching process of removing the planarization layer in the first region may be performed using a process gas including an oxygen gas and a nitrogen gas. The process gas may further include an argon gas. The SOH layer may be formed of a carbon-based SOH layer or a silicon-based SOH layer. The SOH layer may be formed by coating a resin solution on the laminated metal layer and baking the resin solution to form a cured resin layer.

The selectively removing the planarization layer in the first region may include forming an inorganic anti-reflective layer pattern on the planarization layer, the inorganic anti-reflective layer pattern exposing the planarization in the first region, etching the exposed planarization layer using the inorganic anti-reflective layer pattern as an etch mask, and removing the inorganic anti-reflective layer pattern. The forming the inorganic anti-reflective layer pattern may include forming an inorganic anti-reflective layer on the planarization layer, forming a photo sensitive layer pattern covering the inorganic anti-reflective layer in the second region, dry-etching the inorganic anti-reflective layer in the first region to expose the planarization layer in the first region, and removing the photo sensitive layer pattern.

The laminated metal layer may be formed by sequentially stacking first to third metal layers. The first to third metal layers may be formed of a lower titanium nitride layer, a tantalum nitride layer and an upper titanium nitride layer, respectively.

The method may further include removing an uppermost metal layer of the laminated metal layer in the first region using the planarization layer pattern as an etch mask, removing the planarization layer pattern, forming a capping metal layer filing the first and second grooves on the resultant where the planarization layer pattern is removed, and planarizing the capping metal layer and the laminated metal layer until a top surface of the interlayer insulating layer is exposed, thereby forming a first metal gate electrode in the first groove and a second metal gate electrode in the second groove. The planarization layer pattern may be removed using an ashing process which employs an $N_2H_2$ gas as a process gas. The capping metal layer may be formed of an aluminum alloy layer.

The method may further include forming an insulating layer on the semiconductor substrate having a first region and a second region. The insulating layer is formed to include an interlayer insulating layer and a gate insulation layer. The interlayer insulating layer has first and second grooves respectively disposed in the first and second regions, and the gate insulation layer covers at least bottom surfaces of the first and second grooves. A laminated metal layer is formed on the substrate including the insulating layer. A planarization layer having non-photo sensitivity is formed on the laminated metal layer. The planarization layer is formed to fill the first and second grooves. The planarization layer in the first region is partially etched using a dry etching process to form a first planarization layer residue remaining in the first groove and a planarization layer pattern covering the laminated metal layer in the second region.

The non-photo sensitive planarization layer may be formed of a spin on hardmask (SOH) layer or an amorphous carbon layer, and partially etching the planarization layer in the first region may be performed using a process gas including an oxygen gas and a nitrogen gas. The process gas may further include an argon gas. The SOH layer is formed of a carbon-based SOH layer or a silicon-based SOH layer.

The forming the first planarization layer residue and the planarization layer pattern may include forming an inorganic anti-reflective layer pattern on the planarization layer, the inorganic anti-reflective layer pattern exposing the planarization layer in the first region, partially etching the exposed planarization layer using the inorganic anti-reflective layer pattern as an etch mask, thereby leaving a portion of the planarization layer in the first groove, and removing the inorganic anti-reflective layer pattern. In addition, forming the inorganic anti-reflective layer pattern may include forming an inorganic anti-reflective layer on the planarization layer, forming a photo sensitive layer pattern on the inorganic anti-reflective layer in the second region, dry-etching the inorganic anti-reflective layer in the first region to selectively expose the planarization layer in the first region, and removing the photo sensitive layer pattern.

The laminated metal layer may be formed by sequentially stacking first to third metal layers. The first to third metal layers may be formed of a lower titanium nitride layer, a tantalum nitride layer and an upper titanium nitride layer, respectively.

The method may further include partially etching an uppermost metal layer of the laminated metal layer in the first region to form a first metal residue which exists in the first groove and surrounds sidewalls and a bottom surface of the first planarization layer residue, partially etching the planarization layer pattern to form a second planarization layer residue existing in the second groove, partially etching an uppermost metal layer of the laminated metal layer in the second region to form a second metal residue which exists in the second groove and surrounds sidewalls and a bottom surface of the second planarization layer residue, and removing the second planarization layer residue. The first metal residue may be removed during formation of the second metal residue. Moreover, the first planarization layer residue may be removed while the planarization layer pattern is partially etched or the second metal residue is formed. Partially etching the uppermost metal layer in the first region and the second region may be performed using a wet etching process. In contrast, partially etching the planarization layer pattern may be performed using a dry etching process. The second planarization layer residue may be removed using an ashing process which employs an $N_2H_2$ gas as a process gas. The method may further include forming a capping metal layer filling the first and second grooves on the resultant where the second planarization layer residue is removed, and planarizing the capping metal layer and the laminated metal layer until a top surface of the interlayer insulating layer is exposed, thereby forming a first metal gate electrode in the first groove and a second metal gate electrode in the second groove. The capping metal layer may be formed of an aluminum alloy layer. The aluminum alloy layer may contain titanium.

The foregoing and/or other aspects and utilities of the present general inventive concept may be achieved by providing a method of fabricating a semiconductor device, the method including providing a semiconductor substrate having a first region and a second region, forming an insulation layer formed with a first groove and a second groove, forming a laminated metal layer having a plurality of metal layers on the insulation layer; processing the laminated metal layer to have a first number of metal layers from the plurality of metal layers of the laminated metal layer in the first region and a second number of metal layers from the plurality of metal layers of the laminated metal layer in the second region, forming a capping metal layer on the first number of metal layers in the first region and the second number of metal layers in the second region, and planarizing the capping metal layer with the first number of metal layers to form a first metal gate electrode in the first groove of the first region, and with the second number of metal layers to form a second metal gate electrode in the second groove of the second region.

The second number of metal layers of the second region may be the same number of the plurality of metal layers, and the first number of metal layers of the first region may be smaller than the second number of metal layers of the second region.

The first number of metal layers may have different thickness, and one of the second number of metal layers may have a thickness thinner than another one of the second number of metal layers.

The planarizing of the capping metal layer may include forming the first gate electrode as a single layer to have a first working function, and forming the second gate electrode to have a second working function of one of the second number of metal layers.

The first number of metal layer may include a first, a second, and a third metal layers; the processing of the laminated metal layer comprises removing the third metal layer, and the planarizing of the capping metal layer may include forming the capping metal layer and the first and second metal layers as the first gate electrode of a single layer having a working function.

The second number of metal layer may include a first, a second, and a third metal layers, and the planarizing of the capping metal layer may include processing the capping metal layer and the third metal layer as an alloy layer, the second metal layer, and the first metal layer having a working function.

The processing of the laminated metal layer may include forming a planarization layer having non-photo sensitivity on the laminated metal layer, the planarization layer being formed to fill the first and second grooves, and selectively removing the planarization layer in the first region using a dry etching process to expose at least a portion of the laminated metal layer in the first region and to form a planarization layer pattern covering the laminated metal layer in the second region.

The processing of the laminated metal layer may further include selectively processing the exposed portion of the laminated metal layer and the formed planarization pattern using an anti-reflective layer and a photo sensitive layer, to form the first number of metal layer in the first region and the second number of metal layers in the second region.

The processing of the laminated metal layer may include forming a planarization layer having non-photo sensitivity on the laminated metal layer, the planarization layer being formed to fill the first and second grooves, and partially etching the planarization layer in the first region using a dry etching process to form a first planarization layer residue remaining in the first groove and a planarization layer pattern covering the laminated metal layer in the second region.

The processing of the laminated metal layer may further include selectively processing the first planarization layer reside and the planarization layer pattern by selectively forming and etching an anti-reflective layer and a photo sensitive layer, to form the first number of metal layer in the first region and the second number of metal layers in the second region.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE DRAWINGS

Figure 1:
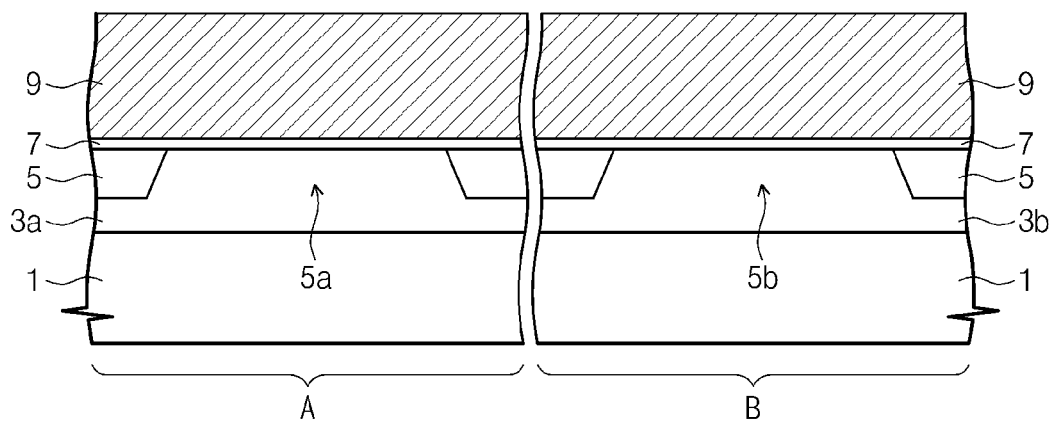
FIGS. 1 to 9 are cross-sectional views to illustrate a method of fabricating a semiconductor device according to an embodiment of the inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures As used herein, the term "and/or" includes any and all combinations of one or more of the associated listed items. It will be understood that when an element is referred to as being "connected" or "coupled" to another element, it may be directly connected or coupled to the other element or intervening elements may be present. Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

FIGS. 1 to 9 are cross sectional views to illustrate a method of fabricating a semiconductor device according to an embodiment of the inventive concept.

Referring to FIG. 1, a semiconductor substrate 1 having a first region A and a second region B may be provided. In an example embodiment, the first region A may correspond to an N-channel MOS transistor region, and the second region B may correspond to a P-channel MOS transistor region. An isolation layer 5 may be formed at a predetermined region of the semiconductor substrate 1 to define a first active region 5a and a second active region 5b in the first region A and the second region respectively.

A first well 3a and a second well 3b may be formed in the semiconductor substrate 1 of the first region A and the semiconductor substrate 1 of the second region B, respectively. When the first region A is an N-channel MOS transistor region and the second region B is a P-channel MOS transistor region, the first well 3a may be a P-type well and the second well 3b may be an N-type well. The first and second wells 3a and 3b may be formed before or after formation of the isolation layer 5.

A gate insulation layer 7 and a dummy conductive layer 9 may be sequentially formed on a substrate unit including the isolation layer 5. In one example embodiment, the gate insulation layer 7 may be formed to include a high-k dielectric layer, and the dummy conductive layer 9 may be formed of a polysilicon layer.

Figure 2:
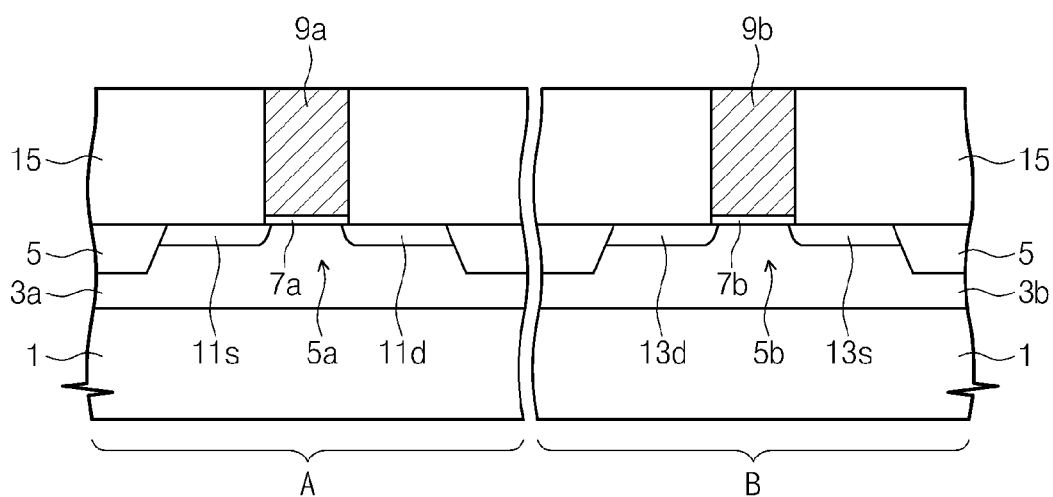

Referring to FIG. 2, the dummy conductive layer 9 and the gate insulation layer 7 may be patterned to form a first gate insulation layer 7a and a first dummy gate electrode 9a sequentially stacked on a portion of the first active region 5a as well as a second gate insulation layer 7b and a second dummy gate electrode 9b sequentially stacked on a portion of the second active region 5b. The first dummy gate electrode 9a may be formed to extend onto the isolation layer 5 adjacent to the first active region 5a. That is, the first dummy gate electrode 9a may be formed to cross over the first active region 5a. Similarly, the second dummy gate electrode 9b may also be formed to cross over the second active region 5b.

Impurity ions of a first conductivity type may be implanted into the first active region 5a using the first dummy gate electrode 9a and the isolation layer 5 as implantation masks, thereby forming a first source region 11s and a first drain region 11d separated from each other. Further, impurity ions of a second conductivity type may be implanted into the second active region 5b using the second dummy gate electrode 9b and the isolation layer 5 as implantation masks, thereby forming a second source region 13s and a second drain region 13d separated from each other. When the first region A is an N-channel MOS transistor region and the second region B is a P-channel MOS transistor region, the first conductivity type may be an N-type and the second conductivity type may be a P-type.

An interlayer insulating layer 15 may be formed on the substrate including the first and second source/drain regions 11s, 11d, 13s and 13d. The interlayer insulating layer 15 may be then planarized to expose the first and second dummy gate electrodes 9a and 9b.

Figure 3:
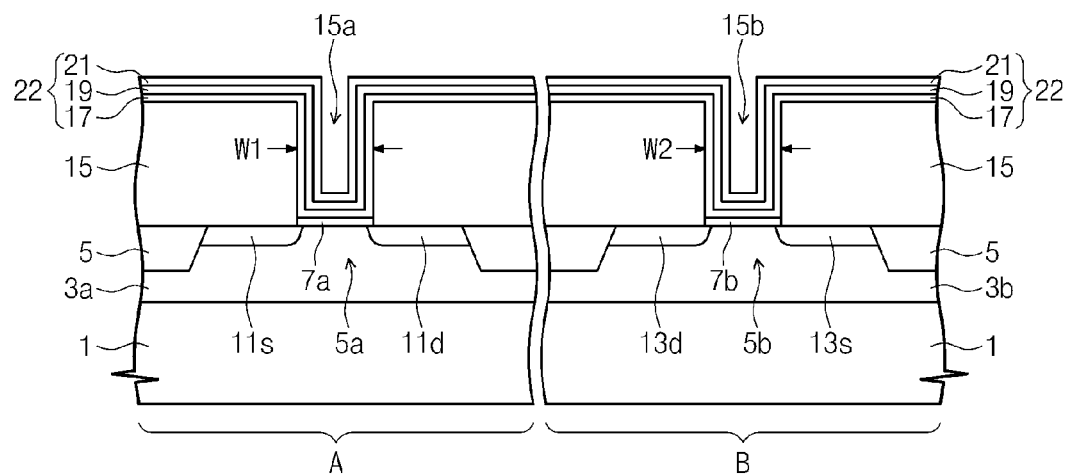

Referring to FIG. 3, the exposed first and second dummy gate electrodes 9a and 9b may be removed. As a result, a first groove 15a exposing the first gate insulation layer 7a may be formed in the interlayer insulating layer 15 of the first region A, and a second groove 15b exposing the second gate insulation layer 7b may be formed in the interlayer insulating layer 15 of the second region B. As illustrated in FIG. 3, the first and second grooves 15a and 15b may have a first width W1 and a second width W2, respectively.

A laminated metal layer 22 may be formed on the substrate unit including the first and second grooves 15a and 15b. A thickness of the laminated metal layer 22 may be less than the first width W1 and the second width W2. The laminated metal layer 22 may be conformably formed not to fill the first and second grooves 15a and 15b. Thus, even after the laminated metal layer 22 is formed, the first and second grooves 15a and 15b may still exist. However, the first and second grooves 15a and 15b surrounded by the laminated metal layer 22 may have aspect ratios which are relatively increased as compared to initial grooves which have been formed through the removal of the first and second dummy gate electrodes 9a and 9b.

The laminated metal layer 22 may include a plurality of metal layers sequentially stacked. For example, the laminated metal layer 22 may be formed by sequentially stacking a first metal layer 17, a second metal layer 19 and a third metal layer 21. In one embodiment, the first, second, and third metal layers 17, 19 and 21 may be formed of a lower titanium nitride layer, a tantalum nitride layer and an upper titanium nitride layer, respectively.

In the event that the first, second, and third metal layers 17, 19 and 21 are respectively formed of the lower titanium nitride layer, the tantalum nitride layer and the upper titanium nitride layer, the second metal layer 19 may be formed to be thinner than the third metal layer 21. For example, the tantalum nitride layer corresponding to the second metal layer 19 may be formed to a thickness of about 30 angstroms, and the upper titanium nitride layer corresponding to the third metal layer 21 may be formed to a thickness of about 80 angstroms.

Figure 4:
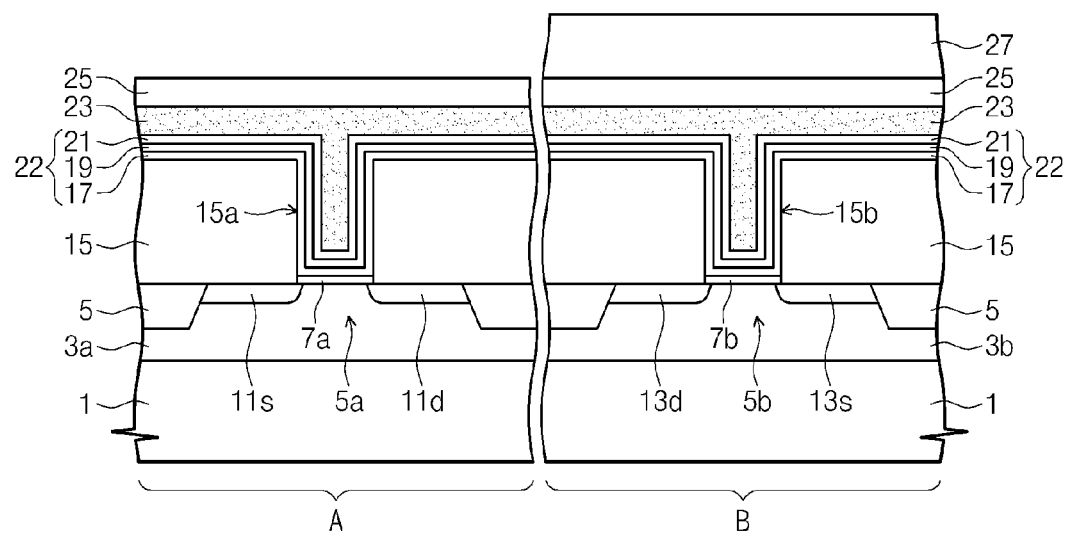

Referring to FIG. 4, a planarization layer 23 may be formed on the laminated metal layer 22 to fill the first and second grooves 15a and 15b, and a photo sensitive layer pattern 27 may be formed to cover the planarization layer 23 in the second region B. The photo sensitive layer pattern 27 may be formed of a photoresist layer.

In another example embodiment, an anti-reflective layer 25 may be additionally formed on the planarization layer 23 prior to formation of the photo sensitive layer pattern 27. In this case, the photo sensitive layer pattern 27 may expose the anti-reflective layer 25 in the first region A.

The anti-reflective layer 25 may be formed of an inorganic anti-reflective layer. For example, the anti-reflective layer 25 may be formed of a silicon oxynitride (SiON) layer.

Figure 5:
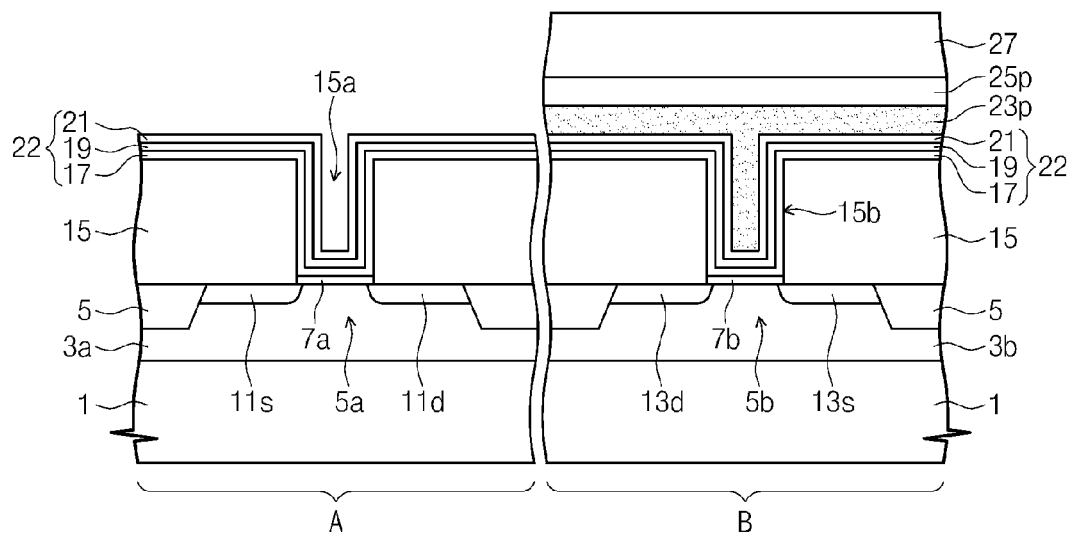

Referring to FIG. 5, the exposed anti-reflective layer 25 may be etched using the photo sensitive layer pattern 27 as an etching mask, thereby forming an anti-reflective layer pattern 25p which exposes the planarization layer 23 in the first region A. When the anti-reflective layer 25 is formed of an inorganic material layer such as a silicon oxynitride (SiON) layer, the anti-reflective layer 25 in the first region A may be etched using a $CHF_4$ gas and an oxygen gas. Subsequently, the exposed planarization layer 23 in the first region A may be anisotropically etched to form a planarization layer pattern 23p exposing the laminated layer 22 in the first region A.

In the event that the planarization layer 23 is etched using an isotropic etching technique such as a wet etching technique, the isotropic etching technique should be carried out for a long time enough to completely remove the planarization layer 23 in the first groove 15a. In this case, the planarization layer 23 in the second region B may be laterally etched to form an undercut below the inorganic anti-reflective layer pattern 25p.

If a distance between the first and second grooves 15a and 15b is significantly decreased to realize highly integrated CMOS circuits, the undercut may extend into the second groove 15b. This undercut may cause some problems. For example, if the undercut exposes the laminated metal layer 22 (e.g., the third metal layer 21) in the second groove 15b, the third metal layer 21 in the second groove 15b may be removed in a subsequent process. In this case, a metal gate electrode to be formed in the first groove 15a may have the same composition as another metal gate electrode to be formed in the second groove 15b. That is, if the planarization layer 23 in the first region A is etched using a wet etching technique, it may be difficult to form metal gate electrodes having different work functions from each other in the first and second grooves 15a and 15b. Accordingly, in an example embodiment, the exposed planarization layer 23 in the first region A may be anisotropically etched to expose the laminated metal layer 22 only in the first region A.

The planarization layer 23 may be formed of a photoresist layer. In this case, an exposure process and a developing process may be required to selectively remove the photoresist layer in the first groove 15a. However, it may be difficult to completely remove the photoresist layer in narrow and deep regions such as the first groove 15a having a high aspect ratio using the exposure process and the developing process. That is, even though the exposure process and the developing process are used to remove the photoresist layer in the first groove 15a, photoresist residues may remain in the first groove 15a. These photoresist residues may disturb a subsequent process of selectively removing the third metal layer 21 in the first region A. Thus, the planarization layer 23 filling the first groove 15a should be easily and completely removed through the anisotropic etching process. That is, even though the planarization layer 23 exists in a narrow and deep region such as the first groove 15a, the planarization layer 23 should be formed of a material layer which can be completely removed using the anisotropic etching process.

The planarization layer 23 may be formed of a spin on hardmask (SOH) layer or an amorphous carbon layer (ACL). Further, the planarization layer 23 may be a non-photo sensitivity material layer. That is, the planarization layer 23 may not contain photo active compound (PAC).

The SOH layer may include a carbon-based SOH layer or a silicon-based SOH layer. In the event that the planarization layer 23 is formed of the SOH layer, forming the SOH layer may include coating a resin solution on the laminated metal layer 22 to fill the first and second grooves 15a and 15b, and baking the resin solution at a temperature of about 400 degrees Celsius to form a cured resin layer.

The cured resin layer may be formed of the carbon-based SOH layer. In this case, one of base resins of the cured resin layer and a cross linker between the base resins may be expressed by the following chemical formulas 1 and 2, respectively.

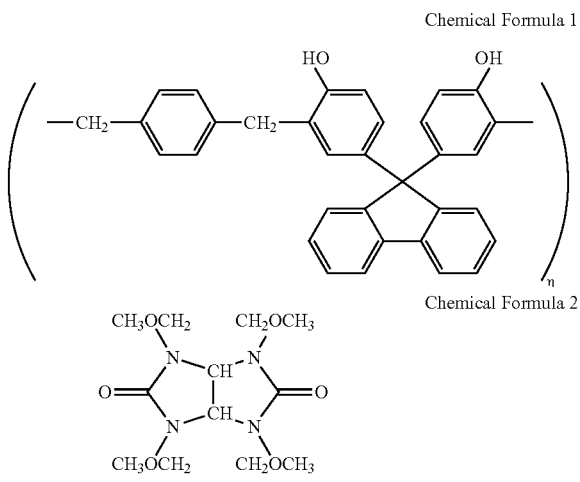

Chemical Formula 1

Chemical Formula 2

The amorphous carbon layer used as the planarization layer 23 may be formed using a chemical vapor deposition (CVD) technique which employs a $C_3H_6$ gas and an inert gas as process gases. The inert gas may include a helium gas or an argon gas.

The anisotropic etching process of selectively removing the planarization layer 23 in the first region A may be performed using a dry etching process which employs an oxygen gas and a nitrogen gas as process gases. The process gases may further include an argon gas.

The photo sensitive layer pattern 27 may be removed during the dry etching process to etch the planarization layer 23 in the first region A. Meanwhile, the anti-reflective layer pattern 25p may have an etch selectivity with respect to the process gases used to etch the planarization layer 23. This may be because the planarization layer 23 is an organic material layer whereas the anti-reflective layer pattern 25p is an inorganic material layer. Thus, the anti-reflective layer pattern 25p may not be removed while the planarization layer 23 in the first region A is etched using the dry etching process.

That is, the anti-reflective layer pattern 25p may act as an etch stop layer or an etch mask while the planarization layer 23 in the first region A is dry-etched.

Figure 6:
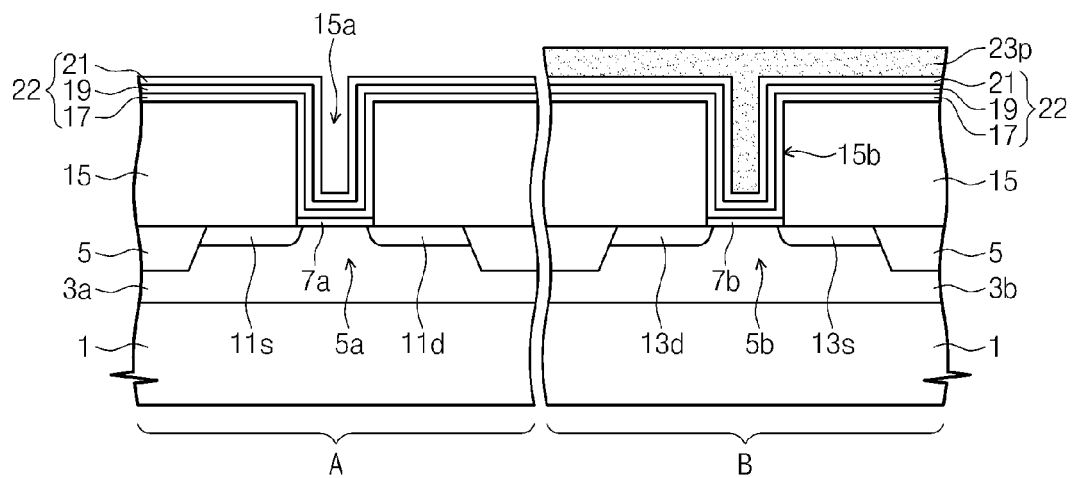

Referring to FIG. 6, even after the planarization layer 23 in the first region A is removed, the photo sensitive layer pattern 27 may remain as illustrated in FIG. 5. In this case, the photo sensitive layer pattern 27 may be removed using an ashing process. The anti-reflective layer pattern 25p in the second region B may be then removed to expose the planarization layer pattern 23p. When the anti-reflective layer pattern 25p is formed of a silicon oxynitride layer, the anti-reflective layer pattern 25p may be removed using a wet etching process or a dry etching process. In an example embodiment, the wet etching process for removing the anti-reflective layer pattern 25p may be performed using a hydrogen fluoride (HF) solution as an etchant. Alternatively, the dry etching process for removing the anti-reflective layer pattern 25p may be performed using an ammonia ($NH_3$) gas and a hydrogen fluoride (HF) gas as etching gases.

Figure 7:
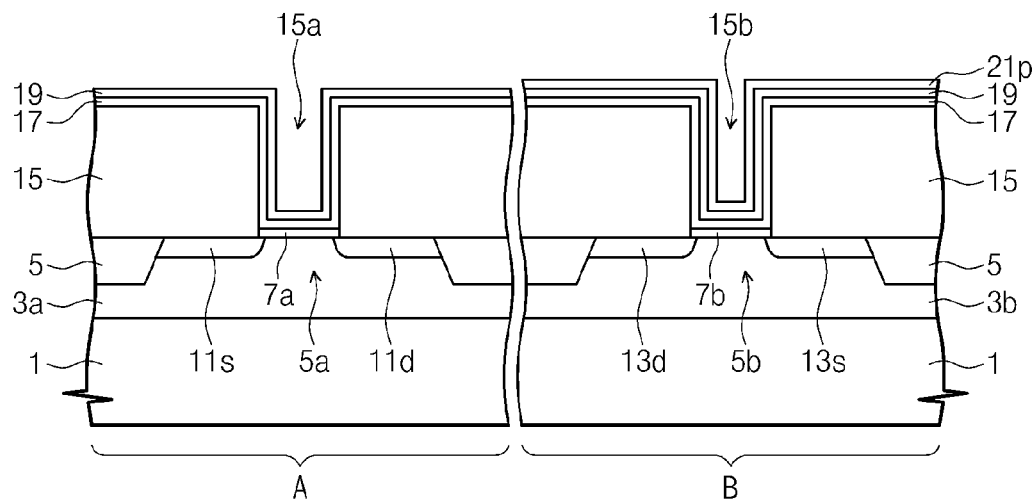

Referring to FIG. 7, an uppermost metal layer of the laminated metal layer 22 in the first region A may be etched using the planarization layer pattern 23p as an etch mask. In an example embodiment, the uppermost metal layer may correspond to the third metal layer 21, e.g., an upper titanium nitride layer. In this case, the upper titanium nitride layer in the first region A may be etched by a wet etching process which employs a hydrogen peroxide ($H_2O_2$) solution as an etchant. As a result, a third metal layer pattern 21p may be formed in the second region B, and the second metal layer 19 in the first region A may be exposed.

After etching the third metal layer 21 in the first region A, the planarization layer pattern 23p may be removed to expose the third metal layer pattern 21p in the second region B. The planarization layer pattern 23p may be removed using an ashing process which employs a hydrogen free gas as a process gas. In an example embodiment, the hydrogen free gas may include an $N_2H_2$ gas. As a result, it can prevent the second metal layer 19 in the first region A and the third metal layer pattern 21p in the second region B from being oxidized during removal of the planarization layer pattern 23p.

Figure 8:
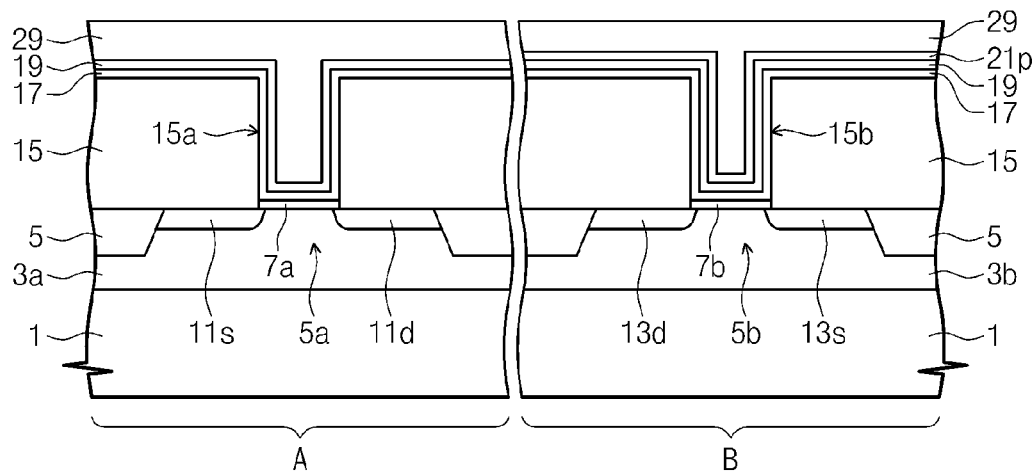
Figure 9:
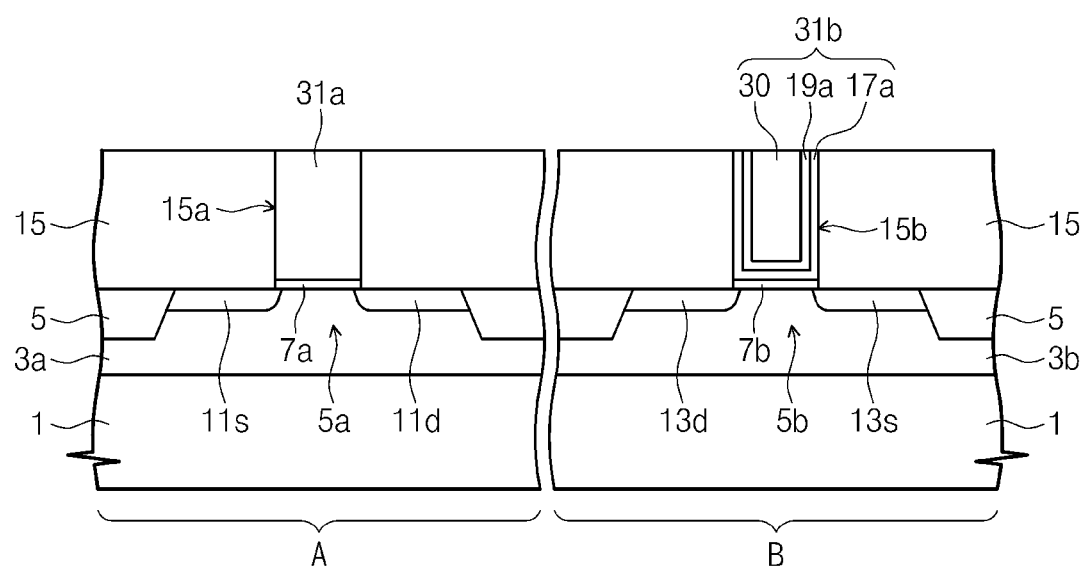

Referring to FIGS. 8 and 9, a capping metal layer 29 filling the first and second grooves 15a and 15b may be formed on the resultant where the planarization layer pattern 23p is removed. The capping metal layer 29 may be formed of an aluminum alloy layer. In an example embodiment, the capping metal layer 29 may be formed of an aluminum alloy layer containing titanium. The capping metal layer 29 may be formed using a reflow process which is performed at a temperature higher than 400 degrees Celsius. As a result, the capping metal layer 29 may be formed to completely fill the first and second grooves 15a and 15b.

Aluminum atoms in the capping metal layer 29 may be diffused at a temperature of about 400 degrees Celsius or the higher temperature. While the capping metal layer 29 is formed, the aluminum atoms of the capping metal layer 29 in the first region A may react on a lower titanium nitride layer corresponding to the first metal layer 17 and a tantalum nitride layer corresponding to the second metal layer 19 in the first region A to form a metal alloy layer (corresponding to a first metal gate electrode 31a) having a first work function which is suitable for a gate electrode of N-channel MOS transistors. Meanwhile, while the capping metal layer 29 is formed, the aluminum atoms of the capping metal layer 29 in the second region B may react on an upper titanium nitride layer corresponding to the third metal layer pattern 21p in the second region B. In this case, a tantalum nitride layer corresponding to the second metal layer 19 in the second region B may act as a blocking layer which prevents additional chemical reaction between the aluminum atoms in the capping metal layer 29 and the lower titanium nitride layer corresponding to the first metal layer 17 in the second region B. That is, the upper titanium nitride layer pattern 21p in the second region B may act as a sacrificial layer while the aluminum atoms of the capping metal layer 29 are diffused out. As a result, the first metal layer 17 in the second region B may have a second work function different from the first work function and may correspond to a substantial metal gate electrode of P-channel MOS transistors.

After formation of the capping metal layer 29, the capping layer 29 and the remaining laminated metal layer may be planarized to expose an upper surface of the interlayer insulating layer 15. Therefore, a first metal gate electrode 31a may be formed in the first groove 15a, and a second metal gate electrode 31b may be formed in the second groove 15b. The first metal gate electrode 31a may have the first work function suitable for N-channel MOS transistors, as mentioned above. The second metal gate electrode 31b may include a first metal layer pattern 17a corresponding to a substantial metal gate electrode of P-channel MOS transistors, a second metal layer pattern 19a stacked on the first metal layer pattern 17a, and an aluminum alloy layer 30 formed on the second metal layer pattern 19a to fill the second groove 15b. The aluminum alloy layer 30 is formed by reacting the capping metal layer 29 with the upper titanium nitride layer pattern 21p.

Figure 10:
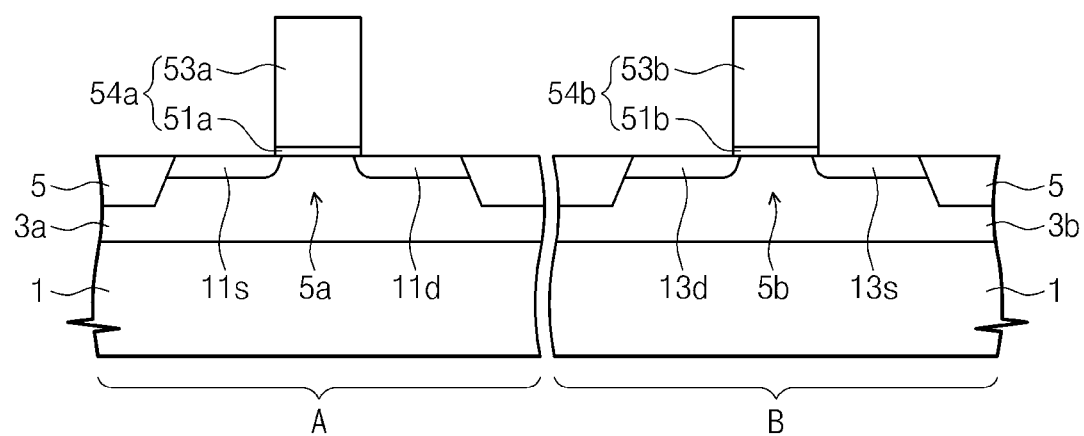
FIGS. 10 to 12 are cross-sectional views to illustrate a method of fabricating a semiconductor device according to an embodiment of the inventive concept.
Figure 11:
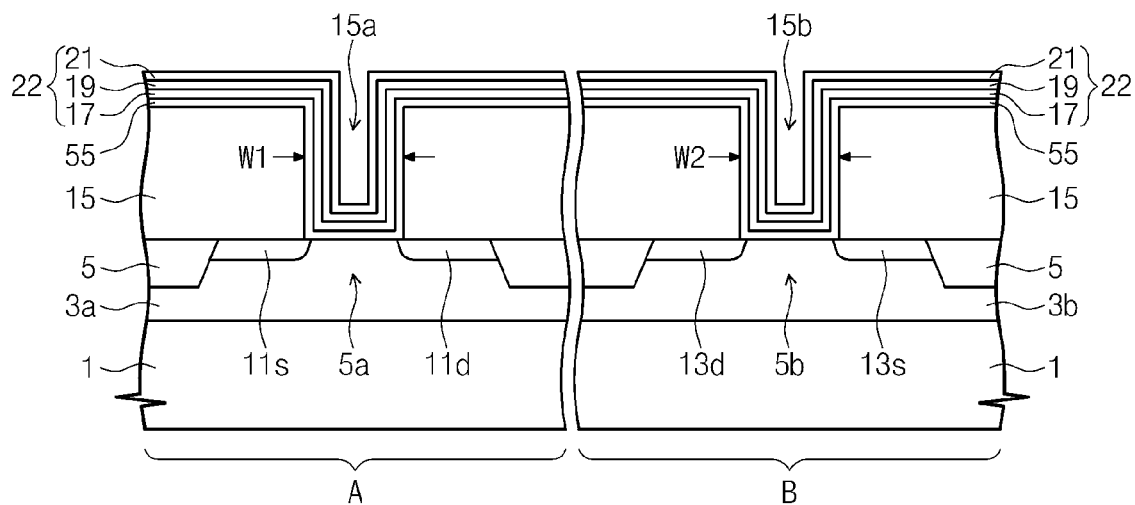
Figure 12:
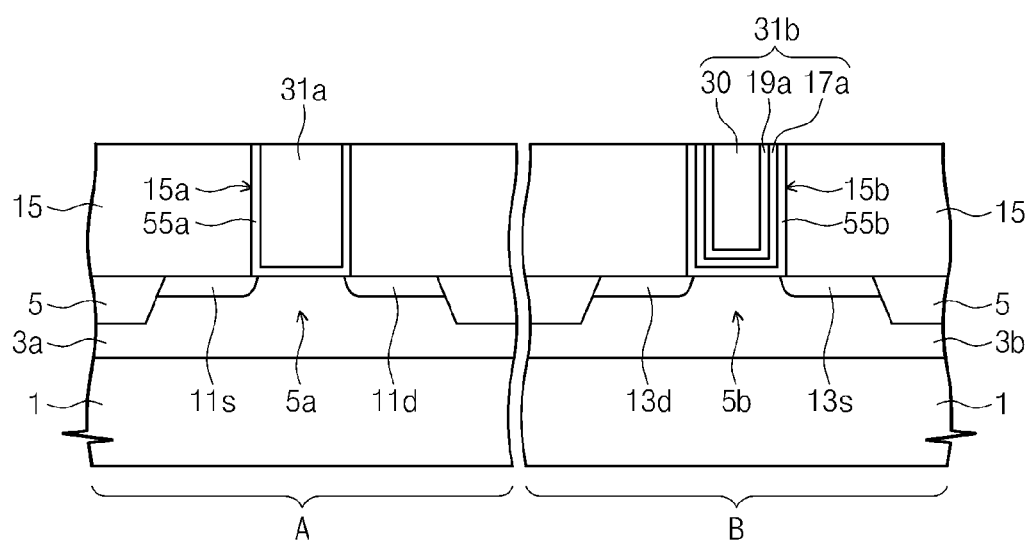

FIGS. 10 to 12 are cross sectional views to illustrate a method of fabricating a semiconductor device according to a second embodiment of the inventive concept. This embodiment is different from the embodiment of FIGS. 1 to 9 in terms of a fabrication method of gate insulation layers.

Referring to FIG. 10, an isolation layer 5, a first well 3a and a second well 3b may be formed in a semiconductor substrate 1 including a first region A and a second region B, using the same manners as described with reference to FIG. 1. The isolation layer 5 may define a first active region 5a in the first region A and a second active region 5b in the second region B, as described with reference to FIG. 1.

A dummy material layer may be formed on the substrate including the isolation layer 5 and the wells 3a and 3b. The dummy material layer may be formed by sequentially stacking a buffer insulating layer and a dummy conductive layer. The buffer insulating layer may be formed of a silicon oxide layer, and the dummy conductive layer may be formed of a polysilicon layer. The dummy material layer may be patterned to form a first dummy gate pattern 54a on the first active region 5a and a second dummy gate pattern 54b on the second active region 5b. As a result, the first dummy gate pattern 54a may be formed to include a first dummy insulating layer pattern 51a and a first dummy gate electrode 53a sequentially stacked, and the second dummy gate pattern 54b may be formed to include a second dummy insulating layer pattern 51b and a second dummy gate electrode 53b sequentially stacked. The first and second dummy gate patterns 54a and 54b may extend onto the isolation layer 5, thereby having line shaped configurations.

Subsequently, using the same manners as described with reference to FIG. 2, first source/drain regions 11s and 11d and second source/drain regions 13s and 13d may be formed in the first active region A and the second region B, respectively.

Referring to FIG. 11, a planarization layer 15 may be formed on the substrate including the first source/drain regions 11s and 11d and the second source/drain regions 13s and 13d, using the same manners as described with reference to FIG. 2. As a result, the first and second dummy gate patterns 54a and 54b may be exposed from the planarization layer 15. The exposed dummy gate patterns 54a and 54b may be removed to form a first groove 15a to expose a portion of the first active region 5a and a second groove 15b to expose a portion of the second active region 5b.

A gate insulation layer 55 may be formed on a substrate unit having the first and second grooves 15a and 15b, and a laminated metal layer 22 may be formed on the gate insulation layer 55. The laminated metal layer 22 may be formed using the same manners as described with reference to FIG. 3. That is, the laminated metal layer 22 may be formed by sequentially stacking first to third metal layers 17, 19 and 21.

Referring to FIG. 12, a first metal gate electrode 31a and a second metal gate electrode 31b may be formed in the first groove 15a and the second groove 15b, respectively. The first and second metal gate electrodes 31a and 31b may be formed using the same manners as described with reference to FIGS. 4 to 9. According to this embodiment, a first gate insulation layer 55a may be formed to cover a bottom surface and sidewalls of the first groove 15a, as illustrated in FIG. 12. Similarly, a second gate insulation layer 55b may be formed to cover a bottom surface and sidewalls of the second groove 15b, as illustrated in FIG. 12. That is, the first gate insulation layer 55a may be formed to surround a bottom surface and sidewalls of the first metal gate electrode 31a, and the second gate insulation layer 55b may be formed to surround a bottom surface and sidewalls of the second metal gate electrode 31b.

FIGS. 13 to 17 are cross sectional views to illustrate a method of fabricating a semiconductor device according to a third embodiment of the inventive concept. This embodiment is different from the embodiment of FIGS. 10 to 12 in terms of a fabrication method of metal gate electrodes.

Figure 13:
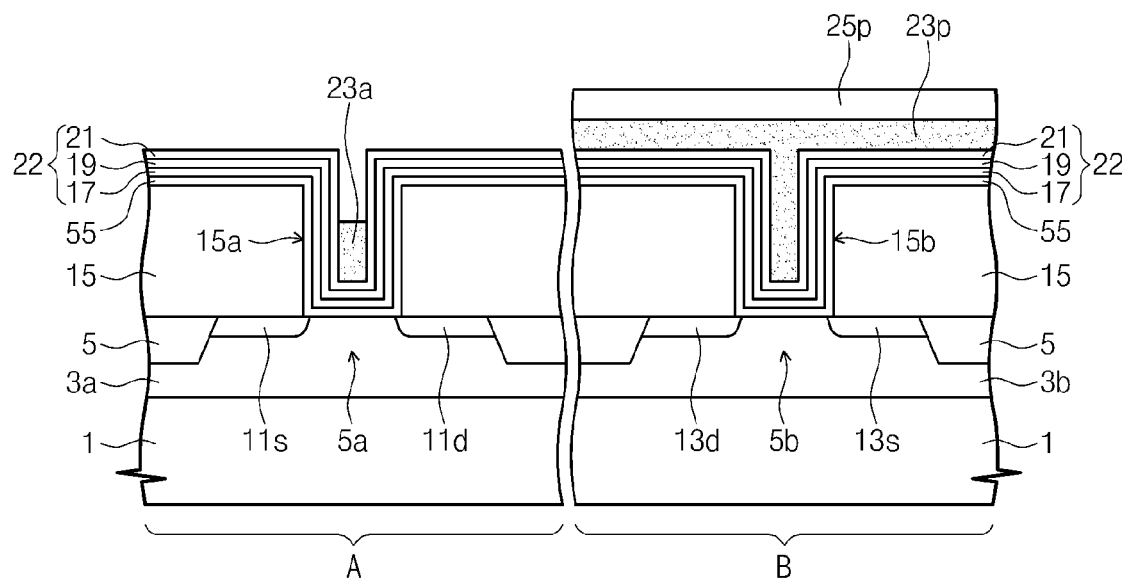
FIGS. 13 to 17 are cross-sectional views to illustrate a method of fabricating a semiconductor device according to an embodiment of the inventive concept.

Referring to FIG. 13, an isolation layer 5, first and second wells 3a and 3b, first and second source/drain regions 11s, 11d, 13s and 13d, an interlayer insulating layer having first and second grooves 15a and 15b, a gate insulation layer 55, and a laminated metal layer 22 may be formed on a semiconductor substrate 1 using the same manners as described with reference to FIGS. 10 and 11.

A planarization layer 23 and an anti-reflective layer pattern 25p may be formed on the laminated metal layer 22 using the same manners as described with reference to FIG. 4. The planarization layer 23 in the first region A may be partially etched using the anti-reflective layer pattern 25p as an etch mask, thereby forming a first planarization layer residue 23a in the first groove 15a and a planarization layer pattern 23p in the second region B. The planarization layer 23 may be partially etched using the same dry etching process as described with reference to FIG. 5. That is, the planarization layer 23 may be partially etched using an oxygen gas and a nitrogen gas as process gases.

Figure 14:
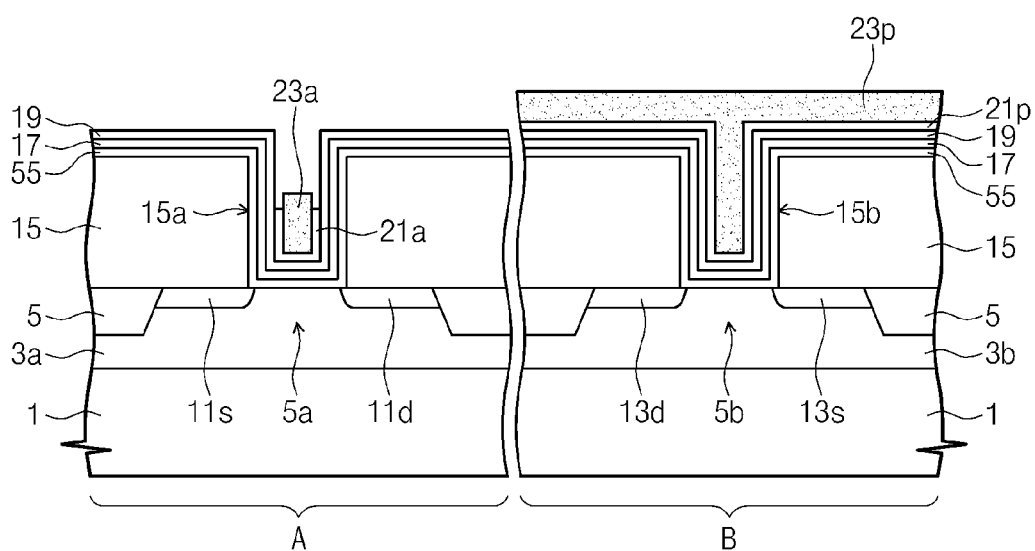

Referring to FIG. 14, the anti-reflective layer pattern 25p may be removed using the same manners as described with reference to FIG. 6. Using the first planarization layer residue 23a and the planarization layer pattern 23p as etching masks, an uppermost metal layer 21 of the laminated metal layer 22 in the first region A may be partially etched to form a first metal residue 21a surrounding a bottom surface and sidewalls of the first planarization layer residue 23a as well as an uppermost metal layer pattern 21p remained in the second region B.

In an example embodiment, the uppermost metal layer 21 of the laminated metal layer 22 may be formed of a titanium nitride layer. In this case, the uppermost metal layer 21 in the first region A may be partially etched by a wet etching process which employs a hydrogen peroxide ($H_2O_2$) solution as an etchant.

Figure 15:
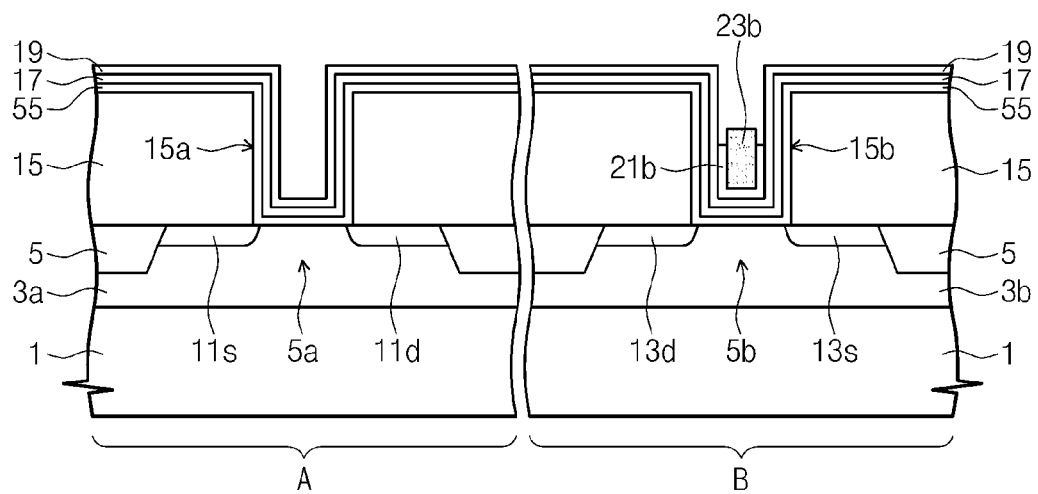

Referring to FIG. 15, after partially etching the uppermost metal layer in the first region A, the planarization layer pattern 23p may be partially etched to form a second planarization layer residue 23b remaining in the second groove 15b. The planarization layer pattern 23p may be partially etched using the same dry etching process as described with reference to FIG. 5. That is, the planarization layer pattern 23p may be partially etched using an oxygen gas and a nitrogen gas as process gases. The first planarization layer residue 23a may be removed while the planarization layer pattern 23p is partially etched.

According to the present embodiment, an over etch time of the dry etching process for partially etching the planarization layer pattern 23p may be reduced as compared to an over etch time of the dry etching process for removing the planarization layer 23 in the first region A of the first embodiment illustrated in FIGS. 4 and 5. That is, a time for which the first region A is exposed to the dry etching process after removal of the first planarization layer residue 23a may be less than a time for which the first region A is exposed to the dry etching process after removal of the planarization layer 23 in the first region A of the first embodiment. This may be because a main etch time for partially etching the planarization layer pattern 23p is less than a main etch time for removing the planarization layer 23 in the first region A of the first embodiment. Thus, according to the present embodiment, etch damage applied to the gate insulation layer 55 in the first groove 15a may be reduced.

Using the second planarization layer reside 23b as an etch mask, the uppermost metal layer pattern 21p may be partially etched to form a second metal residue 21b surrounding a bottom surface and sidewalls of the second planarization layer residue 23b in the second groove 15b. While the uppermost metal layer pattern 21p is partially etched, the first metal residue 21a in the first groove 15a may be removed. The uppermost metal layer pattern 21p may be partially etched using a wet etching process. In an example embodiment, when the uppermost metal layer pattern 21p is formed of a titanium nitride layer, the uppermost metal layer pattern 21p may be partially etched by a wet etching process which employs a hydrogen peroxide ($H_2O_2$) solution as an etchant.

Figure 16:
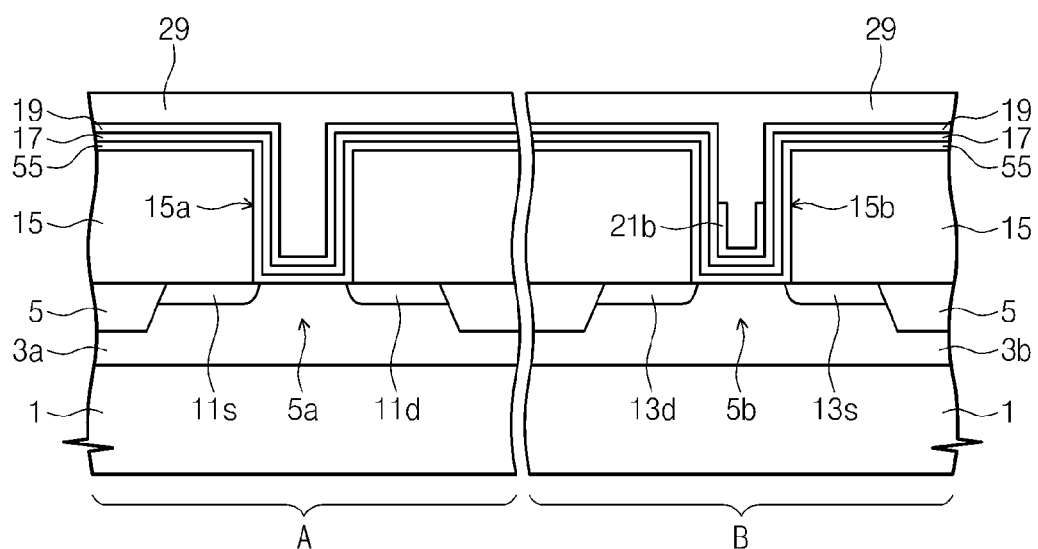
Figure 17:
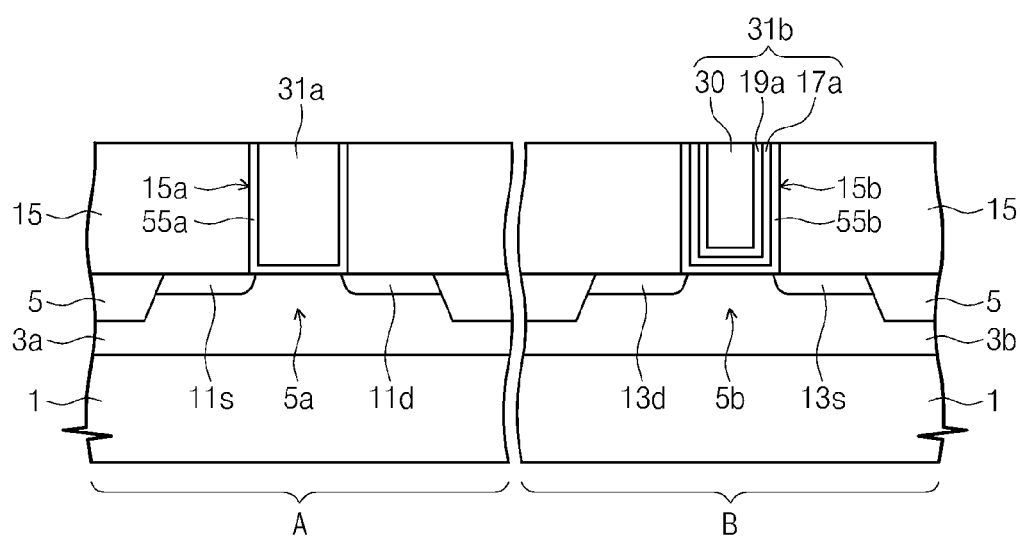

Referring to FIGS. 16 and 17, the second planarization layer residue 23b may be removed using an ashing process. In an example embodiment, the ahing process for removing the second planarization layer residue 23b may be performed using an $N_2H_2$ gas as a process gas, as described with reference to FIG. 7. This is for preventing the second metal layer 19 and the second metal residue 21b from being oxidized during removal of the second planarization layer residue 23b.

A capping metal layer 29 may be formed on the resultant where the second planarization layer residue 23b is removed, and the capping metal layer 29, the remaining laminated metal layer and the gate insulation layer 55 may be planarized to expose a top surface of the interlayer insulating layer 15. As a result, a first gate insulation layer 55a and a first metal gate electrode 31a may be formed in the first groove 15a, and a second gate insulation layer 55b and a second metal gate electrode 31b may be formed in the second groove 15b. The first metal gate electrode 31a may include a metal alloy formed by reacting the capping metal layer 29 with the lower titanium nitride layer corresponding to the first metal layer 17 and the tantalum nitride layer corresponding to the second metal layer 19. The second metal gate electrode 31b may include a first metal layer pattern 17a corresponding to a substantial metal gate electrode of P-channel MOS transistors, a second metal layer pattern 19a stacked on the first metal layer pattern 17a, and an aluminum alloy layer 30 formed on the second metal layer pattern 19a to fill the second groove 15b. The aluminum alloy layer 30 is formed by reacting the capping metal layer 29 with the second metal residue 21b which is a titanium nitride layer pattern. The capping metal layer 29 and the first and second metal gate electrodes 31a and 31b may be formed using the same manners as described in the second and third embodiments.

According to the present embodiment, the uppermost metal layer pattern 21p in the second region B may be partially etched to form the second metal residue 21b having a U-shaped vertical sectional view in a lower portion of the second groove 15b. Thus, a substantial aspect ratio of the second groove 15b may be reduced as compared to the second and third embodiments. As a result, it may be easy to fill the second groove 15b with the capping metal layer 29.

Figure 18:
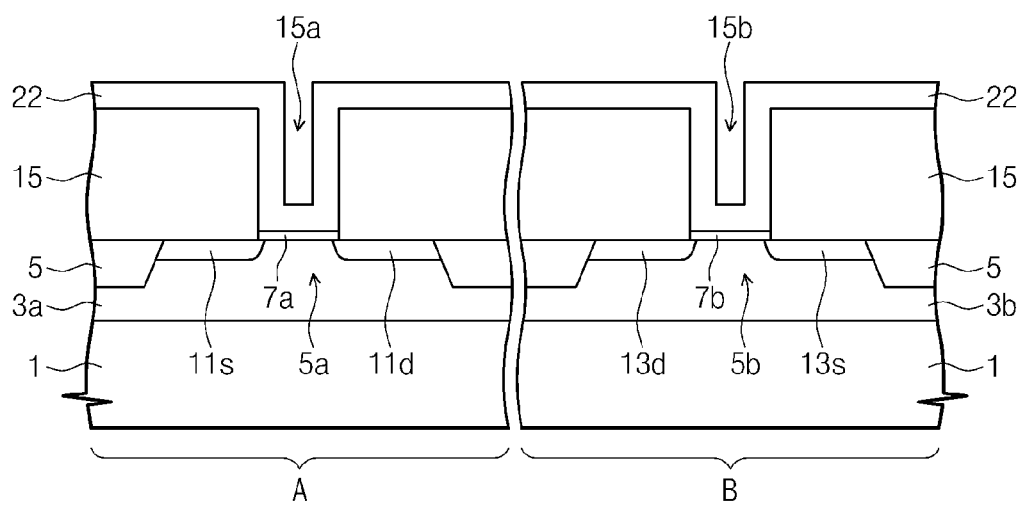
FIGS. 18 and 19 are cross-sectional views to illustrate a method of fabricating a semiconductor device according to an embodiment of the inventive concept.
Figure 19:
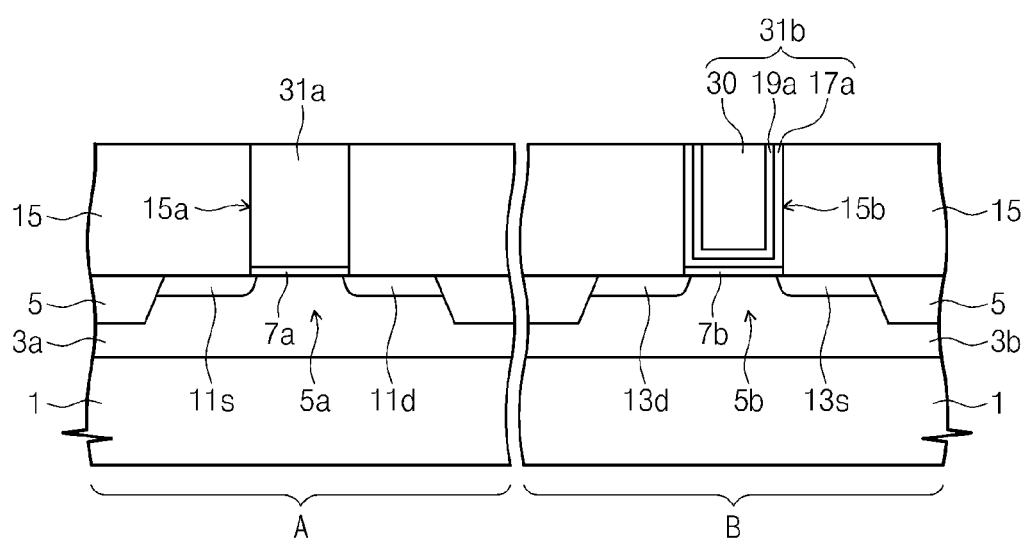

FIGS. 18 and 19 are cross sectional views to illustrate a method of fabricating a semiconductor device according to a fourth embodiment of the inventive concept.

Referring to FIGS. 18 and 19, an interlayer insulating layer 15 having first and second grooves 15a and 15b and a laminated metal layer 22 may be formed on a semiconductor substrate 1 using the same manners as the embodiment described with reference to FIGS. 1 to 9. A first metal gate electrode 31a and a second metal gate electrode 31b may be then formed in the first groove 15a and the second groove 15b, respectively. The first and second metal gate electrodes 31a and 31b may be formed using the same manners as the embodiment described with reference to FIGS. 13 to 17.

Figure 20:
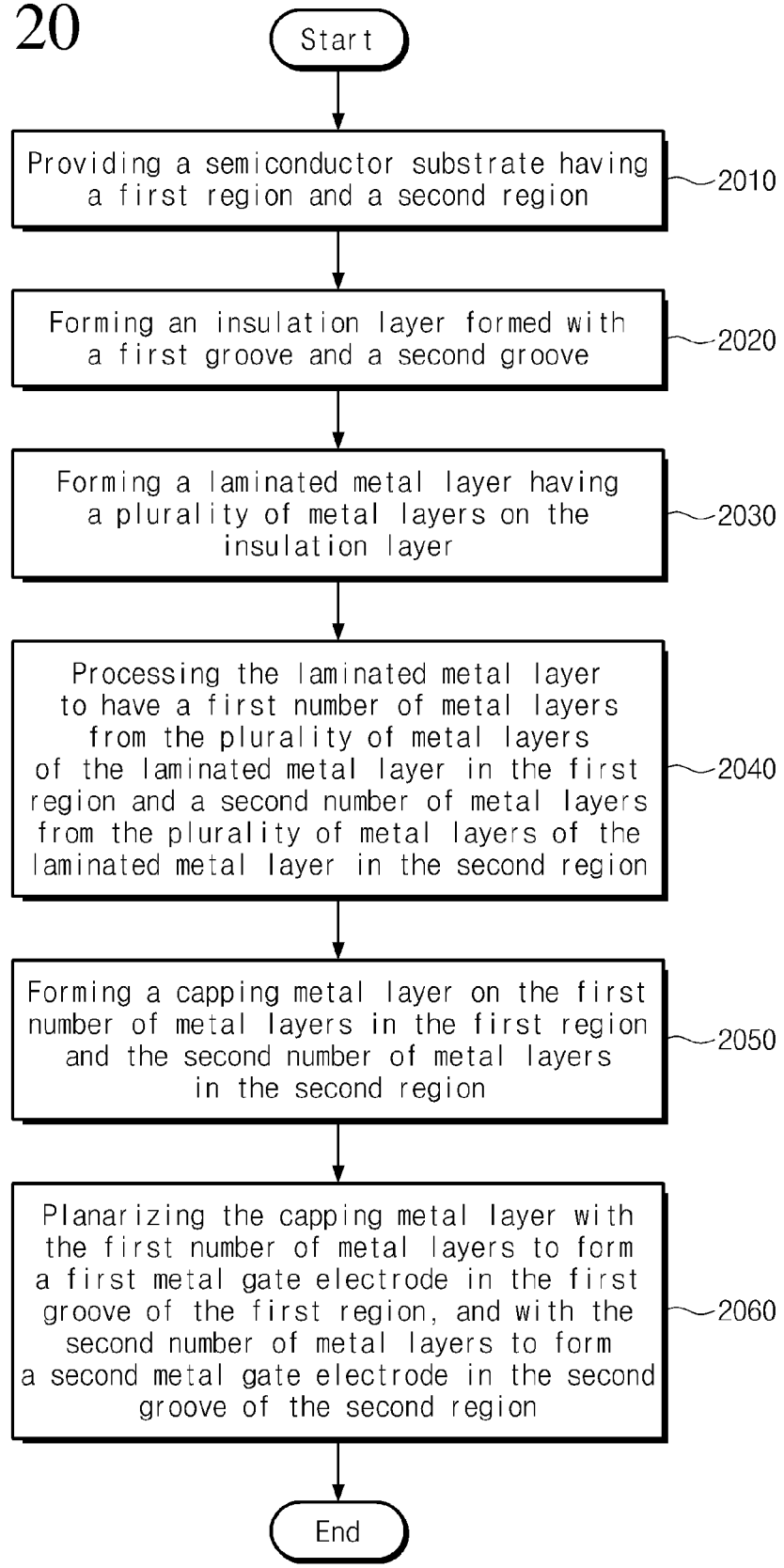
FIG. 20 is a flowchart illustrating a method of fabricating a semiconductor device according to an embodiment of the inventive concept.

Referring to FIG. 20, a semiconductor substrate may be provided to have a first region and a second region at operation 2010. An insulation layer is formed with a first groove and a second groove to correspond to the first region and the second region at operation 2020. A laminated metal layer having a plurality of metal layers is formed on the insulation layer at operation 2030. A process is performed on the laminated metal layer to have a first number of metal layers from the plurality of metal layers of the laminated metal layer in the first region and a second number of metal layers from the plurality of metal layers of the laminated metal layer in the second region at operation 2040. A capping metal layer is formed on the first number of metal layers in the first region and the second number of metal layers in the second region at operation 2050. The capping metal layer is planarized with the first number of metal layers to form a first metal gate electrode in the first groove of the first region, and also with the second number of metal layers to form a second metal gate electrode in the second groove of the second region at operation 2060.

The processing of the method of FIG. 20 may include forming a planarization layer having non-photo sensitivity on the laminated metal layer to fill the first and second grooves, and selectively removing the planarization layer in the first region using a dry etching process to expose at least a portion of the laminated metal layer in the first region and to form a planarization layer pattern covering the laminated metal layer in the second region. The processing of the method of FIG. 20 may further include processing the selectively removed planarization layer and the planarization layer pattern and then forming the capping metal layer thereon.

According to an embodiment of the present general inventive concept, the processing of the method of FIG. 20 may include forming a planarization layer having non-photo sensitivity on the laminated metal layer to fill the first and second grooves, and partially etching the planarization layer in the first region using a dry etching process to form a first planarization layer residue remaining in the first groove and a planarization layer pattern covering the laminated metal layer in the second region. The processing of the method of FIG. 20 may further include processing the first planarization layer residue and the planarization layer pattern, and then forming the capping metal layer thereon.

According to the embodiments set forth above, a laminated metal layer may be conformably formed on a substrate having first and second grooves, a planarization layer filling the first and second grooves may be formed on the laminated metal layer. Even though the planarization layer is formed in the grooves, the planarization layer is formed of a material layer which is easily removable using a dry etching technique. Thus, after the planarization layer is patterned using the dry etching technique to expose the laminated metal layer in the first groove, an uppermost metal layer of the exposed laminated metal layer can be easily removed using the patterned planarization layer as an etch mask. That is, after the planarization layer is patterned using the dry etching technique, no planarization layer residue may exist in the first groove. Accordingly, it may be easy to completely remove the uppermost metal layer in the first groove using the patterned planarization layer as an etch mask. As a result, it is possible to form first and second metal gate electrodes having different work functions from each other without any process defects.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A method of fabricating a semiconductor device, the method comprising:
   providing a semiconductor substrate having a first region and a second region;
   forming an insulating layer on the semiconductor substrate, the insulating layer being formed to include an interlayer insulating layer having first and second grooves respectively disposed in the first and second regions as well as a gate insulation layer covering at least bottom surfaces of the first and second grooves;
   forming a laminated metal layer on the semiconductor substrate including the insulating layer, wherein the laminated metal layer is formed by sequentially stacking first to third metal layers;
   forming a planarization layer having non-photo sensitivity on the laminated metal layer, the planarization layer being formed to fill the first and second grooves; and
   selectively removing the planarization layer in the first region using a dry etching process to expose at least a portion of the laminated metal layer in the first region and to form a planarization layer pattern covering the laminated metal layer in the second region.

2. The method of claim 1, wherein the first region includes an N-channel MOS transistor region and the second region includes a P-channel MOS transistor region.

3. The method of claim 1, wherein forming the insulating layer comprises:
   sequentially forming a gate insulation layer and a dummy conductive layer on the semiconductor substrate including the first and second regions;
   patterning the dummy conductive layer and the gate insulation layer to form a first gate insulation layer and a first dummy gate electrode sequentially stacked in the first region as well as a second gate insulation layer and a second dummy gate electrode sequentially stacked in the second region;
   forming the interlayer insulating layer on the semiconductor substrate having the first and second dummy gate electrodes;
   planarizing the interlayer insulating layer to expose the first and second dummy gate electrodes; and
   removing the exposed dummy gate electrodes to form the first groove exposing the first gate insulation layer and the second groove exposing the second gate insulation layer.

4. The method of claim 1, wherein forming the insulating layer comprises:
   forming a dummy material layer on the semiconductor substrate having the first and second regions;
   patterning the dummy material layer to form a first dummy gate pattern in the first region and a second dummy gate pattern in the second region;
   forming the interlayer insulating layer on the semiconductor substrate having the first and second dummy gate patterns;
   planarizing the interlayer insulating layer to expose the first and second dummy gate patterns;
   removing the exposed dummy gate patterns to form the first groove in the first region and the second groove in the second region; and
   forming the gate insulation layer on the semiconductor substrate having the first and second grooves, the gate insulation layer being formed in a conformal manner,
   wherein the laminated metal layer is formed on the gate insulation layer.

5. The method of claim 1, wherein the non-photo sensitive planarization layer is formed of a spin on hardmask (SOH) layer or an amorphous carbon layer (ACL), and wherein the dry etching process for removing the planarization layer in the first region is performed using a process gas including an oxygen gas and a nitrogen gas.

6. The method of claim 5, wherein the process gas further includes an argon gas.

7. The method of claim 5, wherein the SOH layer is formed of a carbon-based SOH layer or a silicon-based SOH layer.

8. The method of claim 7, wherein forming the SOH layer comprises:
   coating a resin solution on the laminated metal layer to fill the first and second grooves; and
   baking the resin solution to form a cured resin layer.

9. The method of claim 1, wherein selectively removing the planarization layer in the first region comprises:
   forming an inorganic anti-reflective layer pattern on the planarization layer, the inorganic anti-reflective layer pattern exposing the planarization in the first region;
   etching the exposed planarization layer using the inorganic anti-reflective layer pattern as an etch mask; and
   removing the inorganic anti-reflective layer pattern.

10. The method of claim 9, wherein forming the inorganic anti-reflective layer pattern comprises:
    forming the inorganic anti-reflective layer on the planarization layer;
    forming a photo sensitive layer pattern covering the inorganic anti-reflective layer in the second region;
    dry-etching the inorganic anti-reflective layer in the first region to expose the planarization layer in the first region; and
    removing the photo sensitive layer pattern.

11. The method of claim 1, wherein the first to third metal layers are formed of a lower titanium nitride layer, a tantalum nitride layer and an upper titanium nitride layer, respectively.

12. The method of claim 1, further comprising:
removing an uppermost metal layer of the laminated metal layer in the first region using the planarization layer pattern as an etch mask;
removing the planarization layer pattern;
forming a capping metal layer filling the first and second grooves on a resultant where the planarization layer pattern is removed; and
planarizing the capping metal layer and the laminated metal layer until a top surface of the interlayer insulating layer is exposed, thereby forming a first metal gate electrode in the first groove and a second metal gate electrode in the second groove.

13. The method of claim 12, wherein the planarization layer pattern is removed using an ashing process which employs an $N_2H_2$ gas as a process gas.

14. The method of claim 12, wherein the capping metal layer is formed of an aluminum alloy layer.

15. A method of fabricating a semiconductor device, the method comprising:
providing a semiconductor substrate having a first region and a second region;
forming an insulation layer on the semiconductor substrate, the insulation layer formed with a first groove and a second groove;
forming a laminated metal layer having a plurality of metal layers on the insulation layer;
processing the laminated metal layer to have a first number of metal layers from the plurality of metal layers of the laminated metal layer in the first region by removing one of three metal layers of the plurality of metal layers, and a second number of metal layers from the plurality of metal layers of the laminated metal layer in the second region;
forming a capping metal layer on the first number of metal layers in the first region and the second number of metal layers in the second region; and
planarizing the capping metal layer with the first number of metal layers to form a first metal gate electrode in the first groove of the first region, and with the second number of metal layers to form a second metal gate electrode in the second groove of the second region,
wherein the first metal gate electrode is formed as an alloy of a layer of the first number of metal layers in the first region and the capping metal layer in the first region.

16. The method of claim 15, wherein the second number of metal layers of the second region is the same number of the plurality of metal layers, and the first number of metal layers of the first region is smaller than the second number of metal layers of the second region.

17. The method of claim 15, wherein the first number of metal layers have different thickness, and one of the second number of metal layers has a thickness thinner than another one of the second number of metal layers.

18. The method of claim 15, wherein the planarizing of the capping metal layer comprises forming the first metal gate electrode as a single layer to have a first working function, and forming the second metal gate electrode to have a second working function of one of the second number of metal layers.

19. The method of claim 15, wherein:
the laminated metal layer comprises a first metal layer, a second metal layer, and a third metal layer;
the processing of the laminated metal layer comprises removing the third metal layer in the first region; and
the planarizing of the capping metal layer comprises forming the capping metal layer and the first and second metal layers stacked together as the first metal gate electrode having a working function.

20. The method of claim 15, wherein:
the second number of metal layers comprises a first metal layer, a second metal layer, and a third metal layer; and
the planarizing of the capping metal layer comprises forming the capping metal layer and the third metal layer as the alloy, and the second metal layer and the first metal layer to have a working function.

21. The method of claim 15, wherein the processing of the laminated metal layer comprises:
forming a planarization layer having non-photo sensitivity on the laminated metal layer, the planarization layer being formed to fill the first and second grooves; and
selectively removing the planarization layer in the first region using a dry etching process to expose at least a portion of the laminated metal layer in the first region and to form a planarization layer pattern covering the laminated metal layer in the second region.

22. The method of claim 21, wherein the processing of the laminated metal layer further comprises selectively processing the exposed portion of the laminated metal layer and the formed planarization pattern using an anti-reflective layer and a photo sensitive layer, to form the first number of metal layers in the first region and the second number of metal layers in the second region.

23. The method of claim 15, wherein the processing of the laminated metal layer comprises:
forming a planarization layer having non-photo sensitivity on the laminated metal layer, the planarization layer being formed to fill the first and second grooves; and
partially etching the planarization layer in the first region using a dry etching process to form a first planarization layer residue remaining in the first groove and a planarization layer pattern covering the laminated metal layer in the second region.

24. The method of claim 23, wherein the processing of the laminated metal layer further comprises:
selectively processing the first planarization layer residue and the planarization layer pattern by selectively forming and etching an anti-reflective layer and a photo sensitive layer, to form the first number of metal layer in the first region and the second number of metal layers in the second region.

25. A method of fabricating a semiconductor device, the method comprising:
providing a semiconductor substrate having a first region and a second region;
forming an insulating layer on the semiconductor substrate, the insulating layer being formed to include an interlayer insulating layer having first and second grooves respectively disposed in the first and second regions as well as a gate insulation layer covering at least bottom surfaces of the first and second grooves;
forming a laminated metal layer haying a plurality of metal layers on the semiconductor substrate including the insulating layer;
forming a planarization layer having non-photo sensitivity on the laminated metal layer, the planarization layer being formed to fill the first and second grooves;
selectively removing the planarization layer in the first region using a dry etching process that uses argon gas as a process gas to expose at least a portion of the laminated metal layer in the first region and to form a planarization layer pattern covering the laminated metal layer in the second region, and removing an uppermost metal layer of three metal layers of the plurality of metal layers of the laminated metal layer in the first region using the planarization layer pattern as an etch mask.

26. A method of fabricating a semiconductor device, the method comprising:

providing a semiconductor substrate having a first region and a second region;

forming an insulating layer on the semiconductor substrate, the insulating layer being formed to include an interlayer insulating layer having first and second grooves respectively disposed in the first and second regions as well as a gate insulation layer covering at least bottom surfaces of the first and second grooves;

forming a laminated metal layer having a plurality of metal layers on the semiconductor substrate including the insulating layer;

forming a planarization layer having non-photo sensitivity on the laminated metal layer, the planarization layer being formed to fill the first and second grooves;

forming an inorganic anti-reflective layer pattern on the planarization layer, the inorganic anti-reflective layer pattern exposing the planarization in the first region;

selectively removing the planarization layer in the first region using a dry etching process to expose at least a portion of the laminated metal layer in the first region and to form a planarization layer pattern covering the laminated metal layer in the second region; and processing the laminated metal layer to have a first number of metal layers from the plurality of metal layers of the laminated metal layer in the first region by removing one of three metal layers of the plurality of metal layers using the planarization layer pattern as an etch mask, and a second number of metal layers from the plurality of metal layers of the laminated metal layer in the second region.

27. A method of fabricating a semiconductor device, the method comprising:

providing a semiconductor substrate having a first region and a second region;

forming an insulation layer on the semiconductor substrate, the insulation layer formed with a first groove and a second groove;

forming a laminated metal layer having a plurality of metal layers on the insulation layer;

processing the laminated metal layer to have a first number of metal layers from the plurality of metal layers of the laminated metal layer in the first region by removing one of three metal layers of the plurality of metal layers, and a second number of metal layers from the plurality of metal layers of the laminated metal layer in the second region;

forming a capping metal layer on the first number of metal layers in the first region and the second number of metal layers in the second region; and planarizing the capping metal layer with the first number of metal layers to form a first metal gate electrode in the first groove of the first region, and with the second number of metal layers to form a second metal gate electrode in the second groove of the second region.

28. A method of fabricating a semiconductor device, the method comprising:

providing a semiconductor substrate having a first region and a second region;

forming an insulation layer on the semiconductor substrate, the insulation layer formed with a first groove and a second groove;

forming a laminated metal layer having a plurality of metal layers on the insulation layer;

processing the laminated metal layer by forming a planarization layer having non-photo sensitivity on the laminated metal layer, selectively removing the planarization layer in the first region, and removing an uppermost metal layer of three metal layers of the plurality of metal layers in the first region using the planarization layer remained in the second region as an etch mask to have a first number of metal layers from the plurality of metal layers of the laminated metal layer in the first region and a second number of metal layers from the plurality of metal layers of the laminated metal layer in the second region;

forming a capping metal layer on the first number of metal layers in the first region and the second number of metal layers in the second region; and planarizing the capping metal layer with the first number of metal layers to form a first metal gate electrode in the first groove of the first region, and with the second number of metal layers to form a second metal gate electrode in the second groove of the second region.

* * * * *